United States Patent
Nelson et al.

(10) Patent No.: US 7,345,579 B2
(45) Date of Patent: Mar. 18, 2008

(54) TRAILER ILLUMINATION SYSTEM TEST DRIVE AND METHOD OF USE

(76) Inventors: Carl A. Nelson, 94 Knights Bridge La., Summit Point, WV (US) 25446-3534; Douglas B. Morphew, 26645 Jonquil Ave., Elko, MN (US) 55020

( * ) Notice: Subject to any disclaimer, the term of this patent is extended or adjusted under 35 U.S.C. 154(b) by 213 days.

(21) Appl. No.: 11/290,406

(22) Filed: Nov. 30, 2005

(65) Prior Publication Data

US 2007/0120570 A1    May 31, 2007

(51) Int. Cl.
  G08B 21/00    (2006.01)
  G01R 31/00    (2006.01)
(52) U.S. Cl. .................................. 340/431; 324/504
(58) Field of Classification Search ............... 340/431, 340/641, 689; 324/54, 504, 51; 701/29; 200/61.44
  See application file for complete search history.

(56) References Cited

U.S. PATENT DOCUMENTS

| | | | |
|---|---|---|---|
| 3,753,088 A | 8/1973 | Ettelman | |
| 3,800,214 A | 3/1974 | O'Flynn | |
| 3,816,827 A | 6/1974 | Lynn, Jr. | |
| 4,547,722 A * | 10/1985 | Sarlo | 324/504 |
| 6,218,952 B1 * | 4/2001 | Borland et al. | 340/641 |
| 6,535,113 B1 * | 3/2003 | Gravolin | 340/431 |

\* cited by examiner

*Primary Examiner*—Jeffery Hofsass
*Assistant Examiner*—Sigmund Tang
(74) *Attorney, Agent, or Firm*—Raymond M. Galasso; Galasso & Associates, LP

(57) ABSTRACT

A trailer illumination system test device and method of use are disclosed. In one form, a device for testing the functionality of a trailer lighting system is disclosed. The device includes an in-series connection port operable to receive a trailer lighting system plug and a series of trailer light switches operable to simulate an operating condition of a trailer in tow. The device further includes an external power source connection operable to couple an external power source to provide power to simulate the operating condition.

17 Claims, 2 Drawing Sheets

TRAILER ILLUMINATION SYSTEM TEST DRIVE AND METHOD OF USE

FIELD OF THE DISCLOSURE

The present invention generally relates to testers, and more particularly, to a trailer illumination system test device and method of use.

BACKGROUND

Traditional trailer light systems include wiring harnesses that extend to driving such as brake lights and turn signals located on each side of a trailer to indicate when an operator towing a trailer desires to alter a general driving condition of the trailer when in tow. For example, some conventional wiring harnesses extend from a rear portion of a trailer and are consolidated into one or more plugs that are coupled to plugs or connection ports of a vehicle. Such plugs or connection ports are traditionally located near a rear bumper or a trailer hitch portion of the vehicle.

Unlike a typical vehicle lighting system, trailer lighting systems are sometimes exposed to extraneous elements and, as a result, periodically fail. For example, a boat trailer may be submersed into water as a boat is launched and docked onto a trailer. Such exposure to water may degrade a boat trailer lighting system at a later time. For example, corrosion or oxidation of a boat trailer lighting system may occur over time when a boat is stored. When a user desires to tow the boat trailer at a later time, the integrity of the trailer lighting system may be in question and, if failure occurs, may cause delays in departure times. As such, what is needed is a device or system that allows a user to efficiently test a trailer light system prior to departure without having to use a vehicle to couple the trailing lighting system to a vehicles connection port to test a trailer lighting system.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DESCRIPTION

Various forms of a device for testing a trailer lighting system are disclosed. In one form, a device for testing the functionality of a trailer lighting system includes comprising an in-series connection port operable to receive a trailer lighting system plug and a series of trailer light switches operable to simulate an operating condition of a trailer in tow. The device further includes an external power source connection operable to couple an external power source to provide power to simulate the operating condition.

According to another aspect, a device for testing the functionality of a trailer lighting system includes a series of trailer light switches operable to simulate an operating condition of a trailer. The series of trailer light switches includes a power switch, a left turn signal switch, a right turn signal switch, a run signal switch, and a brake signal switch. The device further includes an external power source connector including a positive lead and a negative lead and operable to be connected to a direct current power supply sufficient to provide power to simulate the operating condition.

In another form, a device for testing the functionality of a trailer lighting system includes a first in-series connection port operable to receive a first trailer lighting system plug and a second in-series connection port operable to receive a second trailer lighting system plug wherein the second in-series connection port different from the first. The device further includes a series of trailer light switches operable to simulate an operating condition of a trailer and an external power source connector including a positive lead and a negative lead and operable to be connected to a direct current power supply sufficient to provide power to simulate the operating condition.

Figure 1:
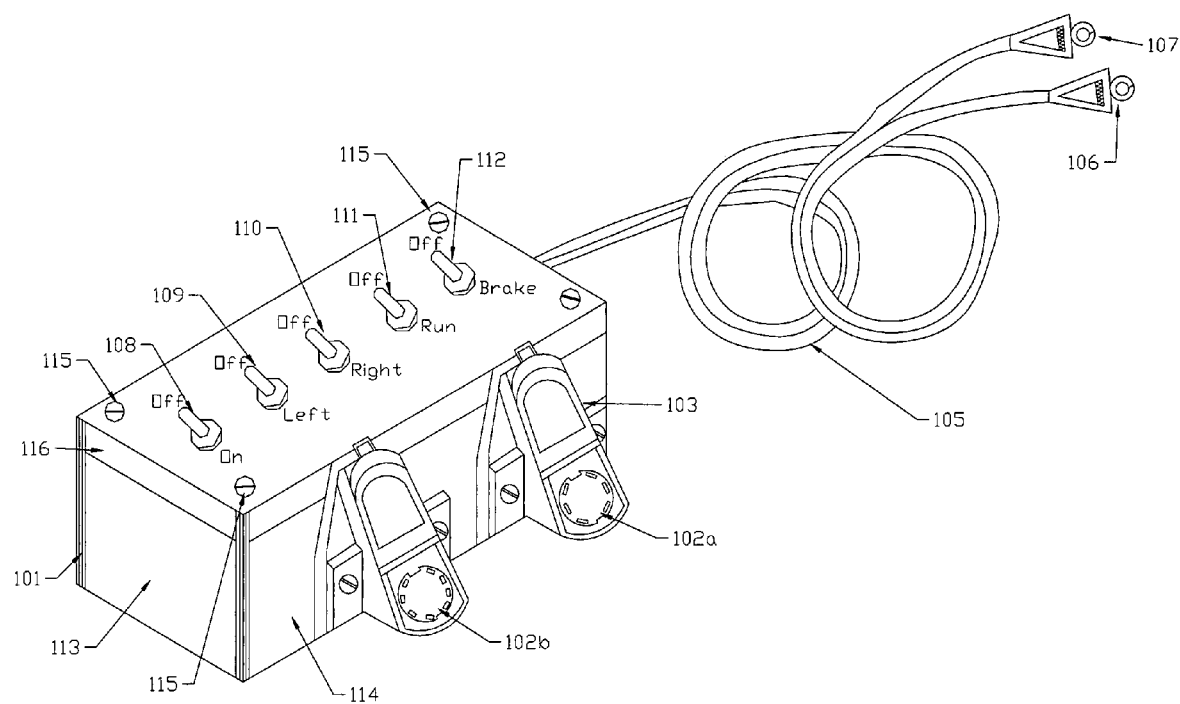
FIG. 1 illustrates a trailer illumination system test device in accordance with one aspect of the present invention.

FIG. 1 illustrates a trailer illumination system test device in accordance with one aspect of the present invention. A trailer illumination system test device, illustrated as trailer light tester 100, includes a housing 101 having a top portion 116 coupled to a main body 114 having a cavity (not expressly shown) for housing electronics, connectors, and wiring of trailer light tester 100. Top portion 116 is coupled to main body 114 using screws 115 although other coupling mechanism may also be used as needed. Trailer light tester 100 further includes an in-series connection port 102 operable having a cover 103 and operable to connect a trailer lighting system's plug to trailer light tester 100. As illustrated, in-series connection port 102a includes a convention recreational vehicle connection port having a six (6) flat pin configuration. Other types of connection ports may also be employed including a four (4) flat pin connector, an eight (8) pin round connector, customized connectors, or any other type of connector may also be used. In one embodiment, an adapter (not expressly shown) may be coupled to in-series connection port 102a to provide various other type of connector configurations thereby extending the number of trailer light test systems that may be tested using trailer light tester 100 without having to provide a separate trailer light tester for each type of trailer light system.

Trailer light tester 100 further includes an external power source cable 105 including a positive lead 107 and a negative lead 106 operable to be connected to a direct current power supply (not expressly shown) sufficient to provide power to simulate an operating condition for a trailer light system. Positive lead 107 and negative lead 106 are illustrated as alligator type connector or clips operable to be temporarily coupled to terminals of a direct current battery such as a vehicle battery, a motorcycle battery, a marine battery, etc. sufficient to power a trailer light system. Cable 105 is preferably an insulated cable having a wire gauge size sufficient to conduct a current from a power source to power a trailer light system. In one embodiment, trailer light tester 100 may include a safety fuse to protect trailer tester 100 and/or trailer light system if an undesirable operating condition exists thereby providing protection to trailer light tester 100, a trailer light system, and an operator of trailer light tester 100.

Trailer light tester 100 further includes a series of trailer light switches operable to simulate an operating condition of a trailer including a left turn signal switch 109, a right turn signal switch 110, a running light or run switch 111 and a brake switch 112. Other switches may also be employed such as a reverse light switch, secondary run light switch, spot light switch, or any other type of switch that may be employed for testing functionality of a trailer lighting system. Trailer light tester 100 further includes a power or hot switch 108 operable to apply power to trailer light system to energize the trailer light system using power provided by cable 105.

During use, a user couples a plug (not expressly shown) to a trailer light system to in-series connection port 102a and connects power to trailer light tester 100 by connecting a power source to positive terminal 106 and negative terminal 107. A user may then energize trailer light tester 100 by turning power switch 108 to the 'hot' position and place each switch or a combination of switches to a desired position to test the trailer light system. For example, a user may place left turn signal switch 109 to the 'left signal' position and may subsequently check the trailer light system's left turn signal to see if it is illuminated. If the left turn signal is illuminated, a user may return the left signal switch 109 to the 'off' position. However, if the left turn signal is not illuminated, a user may troubleshoot and repair the left turn signal and retest as needed. For example, a user may replace a light bulb, check wiring, etc. to locate the problem and repair accordingly. The left turn signal may then be tested again by placing left turn signal switch 109 to the 'left signal' operating position.

Similarly, a user may place right turn signal switch 110 to the 'right signal' position to test the trailer light system's right turn signal to see if the right turn signal light is illuminated. Upon finishing testing, a user may place right turn signal switch 110 to the 'off' position and may activate run switch 111 and brake switch 112 as needed to complete testing of a trailer light system. A user may also activate plural switches to test more than one operating condition for a trailer light system. For example, a user may place run switch 111 to the 'run' position to simulate a low light driving condition. Additionally, a user may select one or more of the remaining switches to ensure the associated lights are activated when tested. For example, a user may ensure that turn signals and brake lights illuminate when run switch 111 is placed in the 'run' position. Other combinations may also be tested as needed. Trailer light tester 100 advantageously allows for a user to test a trailer light system without having to connect a trailer light system to vehicle and allows for a single individual to troubleshoot or test a trailer light system without having somebody step on a brake, activate a turn signal, turn on a vehicles lights, etc.

In one embodiment, trailer light tester 100 may include more than one type of in-series connection port 102a. For example, although illustrated as a six (6) pin connection port, trailer light tester 100 may include another connection port coupled to a portion of housing 101. A second in-series port 102b may be placed next to in-series connection port 102a, along side 113, or any other external portion of trailer light tester 100.

Figure 2:
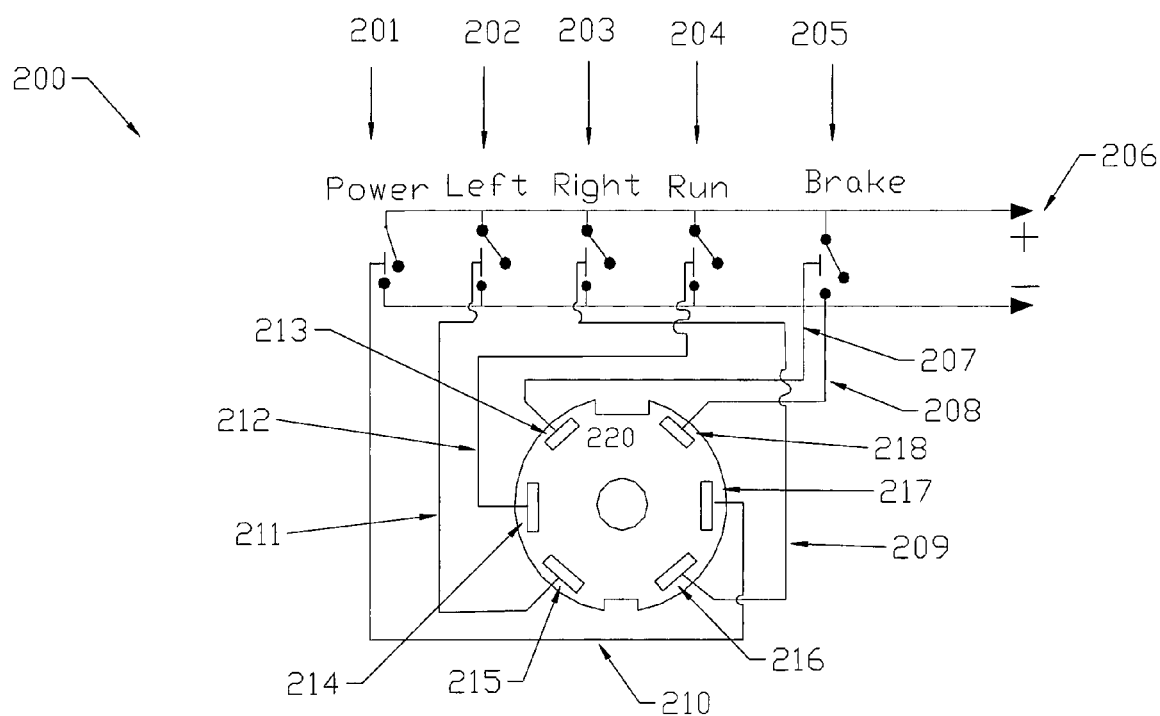
FIG. 2 illustrates a wiring diagram of trailer illumination system test device in accordance with one aspect of the invention.

FIG. 2 illustrates a wiring diagram of trailer illumination system test device in accordance with one aspect of the invention. A trailer illumination system test wiring, illustrated generally as tester wiring 200, includes a power source connector 206 coupled to a series of switches operable to simulate an operating condition of a trailer. Connected in parallel across power source 206 includes a power switch 201, a left turn switch 202, a right turn switch 203, a run switch 204, and a brake switch 205. Additional switches and/or configurations may also be employed.

An in-series connection port 220 is coupled to each switch and is provided to interface a trailer light system's plug. In-series connection port 220 includes a six (6) pin connection port however other types of plugs having various numbers of pins or connectors may be employed. Each tester light switch is connected to an associated pin location and may be soldered to an appropriate terminal of in-series connection port 207. For example, power switch or hot switch 201 is connected via conductor or wire 210 to power or hot terminal 217 of in-series connection port 220. Similarly, left turn switch 202 is connected via conductor or wire 212 to left turn terminal 215, right turn switch 203 is connected via conductor or wire 209 to right turn terminal 216, run switch 204 is connected via conductor or wire 212 to run terminal 214, and brake switch 205 is connected via conductor or wire 207 to brake terminal 213. The negative terminal of power source is connected via conductor or wire 208 to ground terminal 218 of in-series connection port 220.

During operation, a user may place power switch 201 to the on or closed position providing power to in-series connection port 220 to provide a power to a trailer light system. The negative lead of power source 206 is also coupled to ground terminal 218. A user may then select one or more additional switches as desired to energize a specific portion of a trailer light system by activate a specific switch. For example, a user may test a left turn signal by activating left turn switch 202, test a right turn signal by activating right turn switch 203, test running light(s) or marker light(s) by activating run switch 204, and/or test brake lights by activating brake switch 205. Each portion of a trailer light system may be tested by placing a voltage to an appropriate terminal causing an associated lighting circuit to be energized. One skilled in the art can appreciate that other circuit designs may be employed to provide a power source of voltage sufficient to test a trailer light system. Additionally, more than one type of in-series connection port(s) may be added to wiring diagram 200 to test trailers having various other types of connector types or trailer light systems as needed.

Note that although an embodiment of the invention has been shown and described in detail herein, along with certain variants thereof, many other varied embodiments that incorporate the teachings of the invention may be easily constructed by those skilled in the art. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the invention is not intended to be limited to the specific form set forth herein, but on the contrary, it is intended to cover such alternatives, modifications, and equivalents, as can be reasonably included within the spirit and scope of the invention.

What is claimed is:

1. A device for testing the functionality of a trailer lighting system comprising:

an in-series connection port operable to receive a trailer lighting system plug; said in-series connection port includes a six (6) pin round connection port;

a second in-series connection port operable to receive a second type of trailer lighting series plug different from the in-series connection port;

a series of trailer light switches operable to simulate an operating condition of a trailer in tow; and an external power source connection operable to couple an external power source to provide power to simulate the operating condition.

2. The device of claim 1, wherein the series of trailer light switches includes a brake switch operable to test brake lights of the trailer lighting system.

3. The device of claim 1, wherein the series of trailer light switches includes a running light switch operable to test running lights of the trailer lighting system.

4. The device of claim 1, wherein the series of trailer light switches includes a turn signal switch operable to test a turn signal of the trailer lighting system.

5. The device of claim 4, wherein the turn signal switch includes a left turn signal switch.

6. The device of claim 4, wherein the turn signal switch includes a right turn signal switch.

7. The device of claim 1, wherein the in-series connection port includes a recreational vehicle style flat pin socket.

8. The device of claim 1, wherein the in-series connection port includes a four (4) pin flat connection port.

9. A device for testing the functionality of a trailer lighting system comprising:
   a series of trailer light switches operable to simulate an operating condition of a trailer, the series of trailer light switches including:
     a power switch;
     a left turn signal switch;
     a right turn signal switch;
     a run signal switch;
     a brake signal switch;
   a first in-series connection port operable to receive a first plug coupled to a first trailer lighting system; and
   a second in-series connection port operable to receive a second plug coupled to a second trailer lighting system; and
   an external power source connector including a positive lead and a negative lead and operable to be connected to a direct current power supply sufficient to provide power to simulate the operating condition.

10. The device of claim 9 comprising:
   coupling means for connecting a trailer lighting system to the series of trailer light switches; and
   power means for distributing the external power source to the series of trailer light switches.

11. The device of claim 9 further comprising a housing having a top portion, a bottom portion, a side portion and cavity, the top portion including the series of switches.

12. The device of claim 11 further comprising an aperture positioned along the side portion, the aperture allowing passage of the external power source connector.

13. The device of claim 12 further comprising a first alligator connector coupled to the positive lead and a second alligator connector coupled to the negative lead, each connector operable to be coupled to terminals of a battery.

14. The device of claim 11, wherein the housing further comprises a front portion including an in-series connection port coupled to be coupled to a plug of the trailer lighting system.

15. A device for testing the functionality of a trailer lighting system comprising:
   a first in-series connection port operable to receive a first trailer lighting system plug;
   a second in-series connection port operable to receive a second trailer lighting system plug, the second in-series connection port different from the first;
   a series of trailer light switches operable to simulate an operating condition of a trailer; and
   an external power source connector including a positive lead and a negative lead and operable to be connected to a direct current power supply sufficient to provide power to simulate the operating condition.

16. The device of claim 15, wherein the series of trailer light switches contains, a left signal switch, a right signal switch, a run signal switch and a brake signal switch.

17. The device of claim 15, further comprising:
   an insulative housing having a top portion including the series or trailer light switches;
   a first power switch operably coupled to the external power source connector; and
   plural conductive elements housed within the housing and connecting the lighting system plug, the series of trailer light switches and the external power source in a predetermined pattern to simulate a specific operating condition of a trailer when at least one of the trailer light switches is operated.

* * * * *